United States Patent
Oberle

(10) Patent No.: US 6,261,637 B1
(45) Date of Patent: Jul. 17, 2001

(54) USE OF PALLADIUM IMMERSION DEPOSITION TO SELECTIVELY INITIATE ELECTROLESS PLATING ON TI AND W ALLOYS FOR WAFER FABRICATION

(75) Inventor: Robert R. Oberle, Clinton, CT (US)

(73) Assignee: Enthone-OMI, Inc., West Haven, CT (US)

( * ) Notice: Subject to any disclaimer, the term of this patent is extended or adjusted under 35 U.S.C. 154(b) by 716 days.

(21) Appl. No.: 08/573,370

(22) Filed: Dec. 15, 1995

(51) Int. Cl.[7] ....................................................... B05D 5/12
(52) U.S. Cl. ......................... 427/304; 427/98; 427/307; 427/437; 427/443.1; 216/104
(58) Field of Search ..................... 427/98, 304, 305, 427/307, 309, 437, 438, 443.1; 106/1.05, 1.11, 1.22; 216/104, 109; 148/537

(56) References Cited

U.S. PATENT DOCUMENTS

| | | | |
|---|---|---|---|
| 2,694,017 | * 11/1954 | Reschan et al. | 106/1.11 |
| 2,734,837 | * 2/1956 | Hands | 216/109 |
| 3,011,920 | 12/1961 | Shipley, Jr. | 117/213 |
| 3,682,671 | * 8/1972 | Zeblisky | 106/1.05 |
| 3,904,792 | 9/1975 | Gulla et al. | 427/304 |
| 4,122,215 | * 10/1978 | Vranty | 427/437 |
| 4,153,746 | * 5/1979 | Kilthau | 106/1.11 |
| 4,235,648 | * 11/1980 | Richardson | 216/104 |
| 4,900,398 | * 2/1990 | Chen | 216/109 |
| 5,041,356 | * 8/1991 | Takeda et al. | 430/270 |
| 5,147,692 | * 9/1992 | Bengston | 427/437 |
| 5,167,992 | * 12/1992 | Lin et al. | 427/437 |
| 5,243,140 | 9/1993 | Bhatia et al. | 174/254 |
| 5,308,796 | 5/1994 | Feldman et al. | 437/200 |

OTHER PUBLICATIONS

"Precious Metals Science and Technology", Editors: Bemmer, Suzuki, Meyuro, Tanaka, International Precious Metals Inst., 1991. p. 167.

"Electroless Copper Deposition on Metals and Metal Silicides", by Cecilia Y. Mak, Mrs Bulletin/ Aug. 1994, pp. 55–62.

* cited by examiner

*Primary Examiner*—Brian K. Talbot
(74) *Attorney, Agent, or Firm*—DeLio & Peterson, LLC; Richard P. Mueller

(57) ABSTRACT

A method for making integrated circuit wafers wherein the wafer has vias or other openings in the wafer which openings have a barrier/adhesion or other metal layer which is metallized to form the circuit comprising activating the metal layer and then sensitizing the metallic layer using a sensitizing displacement composition comprising preferably an alkaline palladium non-ammonia nitrogen (ethylene diamine) complex which is contacted with the wafer at a specially controlled pH. The wafer is activated using an activation solution which contains a complexing agent for any dissolved metal. The sensitizing solution also preferably contains a complexing agent for dissolved metal and preferably contains a second complexing agent such as EDTA to solubilize base metal contaminants.

12 Claims, No Drawings

USE OF PALLADIUM IMMERSION DEPOSITION TO SELECTIVELY INITIATE ELECTROLESS PLATING ON TI AND W ALLOYS FOR WAFER FABRICATION

BACKGROUND OF THE INVENTION

1. Field of the Invention

The present invention relates to electroless metal plating on metallic surfaces and, in particular, to an electroless metal plating process for forming metallic circuits on silicon wafers in which the wafers have metallic circuit patterns thereon comprising a metallic barrier layer between the wafer substrate and the plated metal.

2. Description of Related Art

In the fabrication of integrated circuits on silicon wafers a series of steps are used to make the finished wafer product. In part of the fabrication process, the wafer is coated with a layer of silicon dioxide ($SiO_2$) and the $SiO_2$ or suitable dielectric is etched to form vias or circuit paths on the wafer which are essentially openings in the $SiO_2$ layer which extend to the silicon layer. The circuit paths are then filled with a conductive metal to form the completed circuit. As is well known, integrated circuit manufacture is very exacting and difficult since the process must be highly reliable and produce wafers having essentially zero defects.

Present wafer metallization schemes use sputtered or evaporated Al-Cu alloys over a previously applied TiW or other suitable barrier/adhesion layer in the opening to fill the opening and complete the circuit. This technology presents some serious drawbacks in terms of its ability to produce circuitry less than 2–2.5 microns line width and to fill the via completely for vias having a height to width aspect ratio greater than 1. At high aspect ratios seams and voids resulting from poor filling not only yield electrical discontinuity and a high via resistance but also invite entrapment of contaminates in subsequent processing steps that in turn often lead to reliability problems. The present metallization schemes try to avoid these problems and use chemical vapor deposition (CVD) or sputtered Al-Cu as the circuit metal but deposition of metals such as aluminum involves many difficulties and requires significant care. Use of directional sputtering has also been investigated but is extremely difficult to control especially at small dimensions and high aspect ratios.

It is desirable to use metals such as nickel or preferably copper for metallization of the wafer because of their electrical properties but these metals and in particular copper have a number of drawbacks, such as a tendency to diffuse through a metal barrier or adhesion layer into the silicon. It is also difficult to etch copper to produce the desired fine line circuit patterns and CVD procedures for depositing copper suffer many complications relating to selectivity and processing temperatures. Accordingly, it is very useful to be able to employ low temperature wet processing techniques such as electroless copper deposition which is relatively economical and easy to use.

A method for the fabrication of electronic devices by electroless copper plating is shown in U.S. Pat. No. 5,308,796 to Feldman et al. and a related article entitled "ELECTROLESS COPPER DEPOSITION ON METALS AND METAL SILICIDES" by a co-inventor, Cecilia Mak, printed in MRS BULLETIN/August 1994, Vol. XIX, No. 8, pages 55–62. Both the patent and publication are incorporated herein by reference. Generally, a thin layer of catalytic material, in particular palladium, is first deposited over a circuit pattern delineated by etched silicon dioxide on a silicon wafer. Annealing converts the palladium adjacent to the silicon surface to $Pd_2Si$ but the Pd on the $SiO_2$ remains unreacted. A selective etch is then used to remove the unreacted Pd, leaving behind only the $Pd_2Si$ at the bottom of the via which overlies the silicon surface. The electroless copper deposition that follows occurs only on the catalytic $Pd_2Si$ areas. Unfortunately, this method has drawbacks because the whole wafer must be coated with the layer of palladium which palladium must then be selectively etched from all but the desired circuit areas which contain $Pd_2Si$. This is a difficult task and remaining palladium on the wafer on other than the desired areas may result in unwanted plating and defective wafers caused by voiding in the vias and other plating problems. The etch solution must then be waste treated to recover the palladium with the inevitable processing and disposal problems.

Another pattern scheme shown in the Mak article, supra, relies on the selective CVD of a thin tungsten film at the bottom of the via. The exposed silicon at the bottom of the via reduces the deposited tungsten hexafluoride to tungsten metal which thin film serves both as a seed layer for subsequent electroless copper deposition and a diffusion barrier layer. It is noted however, that this process has the possibility of forming wormhole-like defects underneath the tungsten layer during the seeding step and that the tungsten film formed solely by silicon reduction may be too porous to be a diffusion barrier layer.

At present, a preferred fabrication technology is to form a tungsten alloy film such as TiW at the bottom of the via by CVD and to metallize the via using CVD technology. One process coats the TiW film with a noble metal typically gold, using CVD techniques with the gold layer serving as both an oxidation protectant and a low ohmic contact for further interconnect metallization. This technique, however, is not entirely satisfactory and it is desired to use more efficient techniques for metallizing vias having a tungsten alloy or other metal barrier layer.

Electroless deposition is the chemical deposition of a metal or mixture of metals over a catalytic surface by chemical reduction and compositions and processes for electroless metal deposition are disclosed in U.S. Pat. No. 3,011,920 incorporated herein by reference. If the substrate to be metal plated is inert—i.e., not catalytic to metal deposition, the conventional process of plating comprises pretreatment to promote cleanliness and adhesion, catalysis of the substrate prior to deposition by treatment with a suitable plating catalyst that renders the surface catalytic to electroless metal deposition followed by a step identified by the art as acceleration.

The catalyst most in commercial use for electroless plating processes comprises the reaction product of a substantial molar excess of stannous tin with palladium ions in a hydrochloric acid solution. The reaction product is believed to be a tin palladium colloid. It is believed that the oxidized stannic tin in combination with unreacted stannous tin and palladium ions form a protective, possibly polymeric, complex for the palladium or palladium-tin alloy while the unreacted stannous ions act as an antioxidant.

An improvement in colloidal tin palladium catalysis is disclosed in U.S. Pat. No. 3,904,792 incorporated herein by reference. In this patent, to provide a catalyst that is less acidic than those disclosed in the aforesaid U.S. Pat. No. 3,011,920, a portion of the hydrochloric acid is replaced by a solution soluble metal halide salt of the acid resulting in a more stable catalyst having a pH that can approach about 3.5.

It is known in the art that using a catalyst formed from the reaction product of stannous tin and noble metal ions, a process sequence would typically include the steps of catalysis of the substrate, acceleration of the catalytic layer, typically with an acid such as fluroboric or perchloric acid and electroless metal deposition. The step of acceleration is known to activate the palladium catalyst, enhance the initiation of the plating reaction and decrease the plating time for total coverage of the part to be plated.

Unfortunately, conventional processes for electroless plating cannot be used for plating silicon wafers because of their lack of selectivity in that the catalysts will catalyze the whole wafer and unless the catalyst is removed from unwanted areas, unwanted plating will occur causing defective parts.

For convenience, the following description will be directed to silicon wafer integrated circuits and tungsten based alloys and in particular TiW alloys used as the metallization barrier layer to be electrolessly plated but it will be understood to those skilled in the art that the invention is directed to sensitizing other metals and metal alloys for electroless metal plating thereon which metals may be used in the fabrication of integrated and other type circuits or products requiring metallization. Aluminum, for example, is typically used as a conductor layer which is also metalized to provide the finished product. One use for aluminum is for chip connection pads such as controlled collapse chip connection pads known as C4 pads. The C4 pads represent the microsockets supporting the C4 solder balls connecting the chip to a substrate such as a thin film substrate. Typically C4 pads are shown in U.S. Pat. No. 5,243,140 incorporated herein by reference.

Bearing in mind the problems and deficiencies of the prior art, it is therefore an object of the present invention to provide a process for catalyzing tungsten and tungsten based alloys and other metals and metal alloys for electroless metal deposition thereon and in particular nickel and electroless copper plating.

It is a further object of the present invention to provide a metallization process for electroless metal plating such as copper on tungsten based alloys and other metals and metal alloys for integrated circuit wafer fabrication which is highly reliable resulting in few, if any, rejects resulting from the electroless metal plating process.

Another object of the invention is to provide a composition for sensitizing tungsten and tungsten based alloys and other metals and metal alloys for electroless metal deposition.

In another object of the invention integrated circuit fabricated wafers are provided having enhanced metal to metal adhesive and other properties.

In still another object of the invention aluminum and other metal pads, such as C4 pads, may be catalyzed for electroless metal plating as part of a C4 bonding process whereby a C4 solder bump is attached to the pad with an intermediate metal layer such as electroless nickel.

Still other objects and advantages of the invention will in part be obvious and will in part be apparent from the specification.

SUMMARY OF THE INVENTION

It has now been discovered that the objects and advantages of the present invention for the selective electroless metal plating of metals and metal alloys and in particular the plating of tungsten and tungsten based alloys used as barrier/ adhesion layers in the fabrication of integrated circuit wafers and other electronic devices wherein the metal is plated on the desired barrier metal layers with no substantial sensitizing and/or plating on other areas of the device comprises:

contacting, when necessary depending on the metal to be plated, the metal layer containing wafer, e.g., the tungsten based alloy, with an activation solution which removes any oxide layer and/or etches the metal layer and which activation solution comprises a complexing agent which forms a complex with the etched metal and preferably contains a chelating agent such as ethylene diamine tetraacetic acid (EDTA) to chelate metal contaminants such as iron, nickel, copper and the like;

contacting the activated wafer with a sensitizing displacement solution which displaces barrier layer metal and replaces it with the sensitizing metal comprising a catalytic metal complex, preferably an alkaline palladium non-ammonia nitrogen complex, a complexing agent for forming a complex with dissolved metal resulting from the contacting to catalyze the metal to be plated and preferably a chelating agent such as EDTA to chelate metal contaminants such as iron, nickel, copper and the like;

rinsing the sensitized wafer; and electrolessly plating the wafer using an electroless metal plating bath, preferably copper.

The activating solution for tungsten and titanium and their alloys is preferably a fluoride containing solution having an alkaline pH. For a barrier or other metal layer such as aluminum, an acidic etchant containing HF and/or HCl is preferred. It is an important feature of the invention that the sensitizing displacement solution preferably comprises a catalytic metal such as palladium in the form of a non-ammonia nitrogen complex, e.g., palladium and ethylene diamine complex, and that the pH of the solution for Ti and W and their alloys be controlled in a range of about 9 to 13, and in a preferred range of 10 to 12 since enhanced substrate sensitization and selective plating are obtained. For aluminum metal substrates a pH range of 10.5–11 is highly preferred.

DESCRIPTION OF THE PREFERRED EMBODIMENTS

The silicon wafers preferably metallized according to the process of the invention comprise a silicon substrate having a silicon dioxide or other such dielectric coating. Vias or other openings in the silicon dioxide layer are provided with a diffusion metal layer such as a tungsten based alloy like TiW by, for example, CVD, and it this layer which must be metallized and the vias filled to provide the desired circuitry of the integrated circuit wafer.

The silicon wafers and the making of integrated circuit chips are well known in the art and are generally described in *VLSI Fabrication Principles* (Silicon and Gallium Arsenide) by Sorab K. Ghandhi, John Wiley & Sons, 1983.

In general, the silicon wafer has deposited thereon a layer of silicon dioxide about 1–5 microns thick which layer is etched to provide the desired circuit pattern in the form of vias or other openings which extend through the silicon dioxide layer to the silicon layer. A metal layer typically a tungsten based alloy serves as a diffusion, barrier and/or adhesion layer and is deposited at the bottom of the circuit opening (via) on the silicon layer by techniques such as chemical vapor deposition (CVD). The thickness of the tungsten based alloy is generally about 200A° to 1000A° but may vary widely. Exemplary metals and/or alloys which may be used as the barrier/adhesion layer include TiW, W, Cr, Al, and Ta.

It is an important feature of the invention that the thickness of the barrier layer not be significantly affected, e.g., reduced, during the metallization process or the barrier properties of the metal will be diminished resulting in, for example, the later electroless metal coating diffusing through the barrier layer into the silicon and causing a defective wafer.

The initial step in the present process is to activate the metal barrier layer when necessary depending on the metal to be plated. Activation is highly preferred regardless of the metal barrier layer and this step is necessary for alloys such as TiW which form an oxide or other film on the surface and may not be required for other alloys depending on their physical and/or chemical characteristics or properties. If activation is required, the activation solution is broadly a solution which will remove the oxide layer and/or dissolve (etch) the metal forming a surface which is clean and oxide free. The solution may be acid or alkaline with alkaline solutions being preferred for $SiO_2$ coated silicon wafers having a Ti/W barrier layer and acid solutions for aluminum barrier layer wafers. A preferred alkaline activation solution contains fluoride ions provided by a salt such as NaF in an amount of about 0.5 to 3% or higher by weight. Other activating materials include ammonium and sodium bifluoride. An acid etchant may contain, for example, HF or $HBF_4$. It is also preferred to employ a chelating agent such as EDTA at a level up to about 1 g/l or higher. Other chelating agents may be selected from a wide variety of materials such as latic acid, malic acid and those containing anions such as acetate, citrate, glycollate, pyrophosphate and the like. The activation solution is generally used at a temperature of about up to about 80° C. or higher and for aluminum preferably 25 to 50° C. for 10 to 60 seconds or more.

It is preferred not to rinse the wafer after the activating step and the activated wafer is transferred directly from the activating step to the palladium sensitizing displacement complex solution.

The sensitizing solution is generally described as a displacement solution and may contain any catalytic metal such as palladium and nickel and is preferably palladium. The catalytic metal such as palladium is theorized to be in the form of a complex and it is preferred that the complex be a nitrogen complex (other than an ammonia complex) such as the highly preferred ethylene diamine palladium complex as shown in "*Precious Metals Science and Technology*" edition Benner, Suzuki, Meyuro and Tanaka, Publ. International Precious Metals Inst. 1991, which publication is incorporated herein by reference. The complex is shown chemically as $PdCl_2(C_2H_8N_2)$ and may be prepared as shown therein by mixing $K_2PdCl_4$ with ethylene diamine (ED) and warming the solution. In general, the preferred molar ratio of ED to Pd for the sensitizing solution is above about 4:1, e.g., about 5 to 1 and may be higher although it is preferred to maintain low free ED in the sensitizing solution. Amounts of catalytic metal of about 0.1 to 10%, preferably 0.5 to 3%, by weight are generally employed in sensitizing solution.

The palladium sensitizing solution also preferably contains a complexing agent such as fluoride ions such as in the form of NaF to complex metal ions removed from the metal/oxide layer. Amounts may vary widely with amounts of about 1 to 5% preferably 2 to about 4 weight % NaF typically being employed. The solution also preferably contains further complexing agents such as EDTA and chelating agents such as those disclosed above for use in the etchant solution in amounts of up to about 1 g/l or more to chelate contaminating ions such as iron, nickel and copper.

It is hypothesized that the following reaction occurs when using the preferred ED/Pd complex on a Ti/W alloy barrier layer:

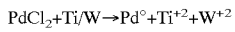

It is an important feature of the invention that the pH of immersion plating solution be specially controlled especially in the range of about 9 to 13 preferably 10 to 12 and an acid such as dilute HCl or base such as NaOH is normally used to adjust the pH to the desired level. For sensitizing aluminum, a pH range of 10.5 to 11 is highly preferred. It has been found that the pH of the sensitizing solution is important for controlling the displacement reaction with values outside the range not providing the reliability needed for integrated circuit manufacture.

The metallized wafer which has previously been activated if necessary, is now contacted with the above palladium catalyst complex sensitizer solution to catalyze the metallic barrier layer. In general, the palladium complex solution is used at a temperature of about 25 to 80° C. for Ti/W alloys and 25 to 60° C. for aluminum at 10 to 60 seconds, preferably 10 to 30 seconds.

It is an important benefit of the invention that no further treatment of the metallized wafer is required after immersion in the palladium complex solution, such as the prior art conventional reduction of the palladium ion to palladium metal using a reducer solution. After the wafer is catalyzed the wafer is rinsed and ready for electroless metal deposition. As is well known, electroless metal plating processes typically use a catalyst solution containing $PdCl_2$—$SnCl_2$—HCl which catalyst provides metallic palladium on the surface to be plated due to the reducing action of the tin. Such solutions cannot be used in the present invention due to their limited operating ranges which cause manufacturing reliability problems. These baths are exemplified in U.S. Pat. No. 3,011,920. The use of a catalytic displacement complex solution such as the ED-Pd complex provides a high selectivity for sensitizing the metal layer without significant sensitizing of the remainder of the electronic component, e.g., silicon dioxide, and provides a large operating window where immersion times and temperatures may be varied significantly without causing wafers which are defective because of plating on unwanted areas of the component.

Electroless copper baths are very well known in the industry and any electroless copper bath may be used in the process of the invention. While electroless copper is the preferred metal, other electroless baths such as electroless nickel, Ni—Co, Co and the like may be used. For convenience, the following description will be directed to electroless copper plating baths.

Broadly stated, the electroless copper bath contains: 1) a source of copper ions, 2) a reducing agent such as formaldehyde, 3) an acid or hydroxide pH adjuster to provide the required pH and 4) a complexing agent for metal ions sufficient to prevent their precipitation in the solution. Compositions for depositing electroless copper are described in U.S. Pat. No. 4,171,225, which patent is hereby incorporated by reference.

If it is desired to use electroless nickel baths, exemplary baths are described in U.S. Pat. Nos.: 2,690,401; 2,690,402; 2,762,723; 2,935,425; and 3,338,726. Other useful compositions for depositing copper and nickel are disclosed in the 63rd Guide Book and Directory Issue of the Metal Finishing for Jan. 19, 1995, Vol. 93, No. 1A, *Elsevier Science, Inc.,* page 402. The foregoing patents and publication are included hereby reference.

Depending on whether electroless copper or electroless nickel is used to plate the metallized layer of the wafer, the conditions may vary depending on the rate of deposition and type of deposit desired. For electroless copper using an acid bath, a temperature of about 50 to about 70° C. for up to about 60 minutes usually 20 to 40 minutes will usually be used. For an electroless nickel bath, either alkaline or acid, an immersion time of about 10 to 60 minutes preferably 15 to 25 minutes at a temperature of about 60 to 85° C. is normally used.

It will be appreciated by those skilled in the art that the rate of electroless plating may be influenced by many factors including 1) pH of the plating solution, 2) concentration of the reductant, 3) temperature of the plating bath, 4) concentration of soluble metal, 5) ratio of the volume of bath to the area plated, 6) presence of rate promoters and 7) presence of wetting agents and/or agitation, and that the above parameters are only provided to give general guidance for practicing the invention.

The composition and process of the presence invention will now be more fully illustrated by the following specific examples which are illustrative and in no way limitive with all percentages by weight and temperatures in degrees centigrade unless otherwise noted.

EXAMPLE

A silicon wafer measuring 6 inches in diameter and containing a number of individual chips, has a coating of silicon dioxide thereon which was etched to form the desired circuit patterns as vias. The wafer was metallized by CVD with a TiW metallization layer of about 500A° at the bottom of the etched vias. The TiW of the wafer was activated by immersion in a 10 g/l NaF solution at 80° C. for 40 seconds. The activated wafer was not rinsed and transferred directly to a palladium catalyst sensitizer solution containing 5 g/l palladium the palladium being in the form of an ED/palladium complex having a molar ratio of ED/Pd of about 4:1, NaF at 20 g/l and EDTA at 1 g/l. The pH of the solution was maintained between about 10.5 to 11 and the wafer was immersed in the solution for 30 seconds at 80° C. After immersion the wafer was thoroughly rinsed in deionized water and plated using a commercial alkaline electroless nickel bath. The wafer was plated by immersion in the bath for 40 minutes at 85° C. and produced commercially acceptable wafer plated products having adherent metal to metal deposits which passed a scotch tape adhesion test. The morphology of the deposits were similar to those obtained with conventional plating.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for the selective electroless metal plating of Ti, W, Ti/W alloy, aluminum or aluminum alloy metal layer used in the fabrication of a silicon integrated circuit wafer coated with a layer of a dielectric material comprising:

forming a desired circuit pattern in the dielectric layer on the wafer in the form of vias or other openings which extend through the dielectric layer to the silicon layer;

depositing the metal layer on the silicon layer in the via or in the other opening;

activating the metal layer of the wafer by contacting the wafer with an activation solution which solution removes metal layer oxides and/or etches the metal layer surface which activation solution is either acid or alkaline and comprises a complexing agent to form a complex with metal which may be removed during the activation step;

sensitizing the activated metal layer of the wafer by contacting the wafer with an alkaline sensitizing solution composition comprising a sensitizing metal non-ammonia nitrogen complex to sensitize the metal layer; and electrolessly metal plating the sensitized metal layer of the wafer by contacting the wafer with an electroless metal plating solution wherein the metal is plated on the sensitized metal layer with no substantial plating on other areas of the wafer.

2. The process of claim 1 wherein the metal layer to be plated is Ti, W, or a Ti/W alloy.

3. The process of claim 2 wherein the activation solution also contains a chelating agent to chelate metal contaminants such as iron, nickel and copper.

4. The process of claim 3 wherein the activation solution is alkaline.

5. The process of claim 4 wherein the activation solution contains fluoride ions as the complexing agent.

6. The process of claim 5 wherein the sensitizing metal is palladium.

7. The process of claim 6 wherein the sensitizing solution has a pH of about 10 to 12.

8. The process of claim 7 wherein the complex is a palladium-ethylene diamine complex.

9. The process of claim 8 wherein the molar ratio of palladium to ethylene diamine in the complex is about 4:1 to 5:1.

10. The process of claim 1 wherein the metal layer to be plated is aluminum and the activation solution is acidic.

11. The process of claim 10 wherein the sensitizing solution composition is a palladium non-ammonia nitrogen complex.

12. The process of claim 11 wherein the pH of the sensitizing solution is about 10.5 to 11 and the complex is a palladium-ethylene diamine complex.

* * * * *